(12) United States Patent
Anderson et al.

(10) Patent No.: US 7,902,000 B2
(45) Date of Patent: Mar. 8, 2011

(54) MUGFET WITH STUB SOURCE AND DRAIN REGIONS

(75) Inventors: Brent A. Anderson, Jericho, VT (US); Andres Bryant, Burlington, VT (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 216 days.

(21) Appl. No.: 12/132,865

(22) Filed: Jun. 4, 2008

(65) Prior Publication Data

US 2009/0302402 A1    Dec. 10, 2009

(51) Int. Cl.
*H01L 29/72* (2006.01)

(52) U.S. Cl. ......... 438/149; 438/197; 438/300; 438/302; 438/479; 257/401

(58) Field of Classification Search .................. 438/149, 438/197, 300, 302, 479; 257/401
See application file for complete search history.

(56) References Cited

U.S. PATENT DOCUMENTS

| | | |
|---|---|---|
| 4,396,252 A | 8/1983 | Turner |
| 4,984,043 A | 1/1991 | Vinal |
| 4,990,974 A | 2/1991 | Vinal |
| 5,055,026 A | 10/1991 | Gordon |
| 5,216,266 A | 6/1993 | Ozaki |
| 6,265,291 B1 | 7/2001 | Yu et al. |
| 6,351,841 B1 | 2/2002 | Tickle |
| 6,525,403 B2 | 2/2003 | Inaba et al. |
| 6,580,137 B2 | 6/2003 | Parke |
| 6,756,612 B1 | 6/2004 | Nemati et al. |
| 6,774,437 B2 | 8/2004 | Bryant et al. |
| 6,787,402 B1 | 9/2004 | Yu |
| 6,831,310 B1 | 12/2004 | Mathew et al. |
| 6,853,020 B1 | 2/2005 | Yu et al. |
| 6,872,602 B1 | 3/2005 | Nemati et al. |
| 6,919,647 B2 | 7/2005 | Hackler, Sr. et al. |
| 6,921,982 B2 | 7/2005 | Joshi et al. |
| 6,924,560 B2 | 8/2005 | Wang et al. |
| 6,924,561 B1 | 8/2005 | Hill et al. |
| 6,980,457 B1 | 12/2005 | Horch et al. |
| 7,026,199 B2 | 4/2006 | Lee |
| 7,029,958 B2 | 4/2006 | Tabery et al. |
| 7,030,425 B1 | 4/2006 | Horch et al. |
| 7,060,539 B2 | 6/2006 | Chidambarrao et al. |
| 7,071,052 B2 | 7/2006 | Yeo et al. |
| 7,074,623 B2 | 7/2006 | Lochtefeld et al. |
| 7,074,660 B2 | 7/2006 | Manger |
| 7,087,499 B2 | 8/2006 | Rankin et al. |
| 7,092,677 B1 | 8/2006 | Zhang et al. |

(Continued)

*Primary Examiner* — Edward Wojciechowicz
(74) *Attorney, Agent, or Firm* — Scully, Scott, Murphy & Presser, P.C.; Anthony J. Canale

(57) ABSTRACT

The present invention provides a semiconductor device that includes at least one semiconductor Fin structure atop the surface of a substrate; the semiconducting fin structure including a channel of a first conductivity type and source/drain regions of a second conductivity type, the source/drain regions present at each end of the semiconductor fin structure; a gate structure immediately adjacent to the semiconductor fin structure, a dielectric spacer abutting each sidewall of the gate structure wherein the each end of the fin structure extends a dimension that is less than about ¼ a length of the Si-containing fin structure from a sidewall of the dielectric spacer; and a semiconductor region to the each end of the semiconductor fin structure, wherein the semiconductor region to the each end of the semiconductor fin structure is separated from the gate structure by the dielectric spacer.

13 Claims, 8 Drawing Sheets

U.S. PATENT DOCUMENTS

| | | |
|---|---|---|
| 7,098,502 B2 | 8/2006 | Mathew et al. |
| 7,098,755 B2 | 8/2006 | Zhao et al. |
| 7,109,516 B2 * | 9/2006 | Langdo et al. .................. 257/19 |
| 7,148,526 B1 | 12/2006 | An et al. |
| 7,163,851 B2 | 1/2007 | Abadeer et al. |
| 2004/0157353 A1 | 8/2004 | Ouyang et al. |
| 2008/0261363 A1 * | 10/2008 | Furukawa et al. ............ 438/241 |

* cited by examiner

MUGFET WITH STUB SOURCE AND DRAIN REGIONS

FIELD OF THE INVENTION

The present invention relates to microelectronics. In one embodiment, the present invention provides a method of forming a finFET device.

BACKGROUND OF THE INVENTION

The dimensions of semiconductor field effect transistors (FETs) have been steadily shrinking over the last thirty 30 years or so, as scaling to smaller dimensions leads to continuing device performance improvements. Planar FET devices have a conducting gate electrode positioned above a semiconducting channel, and electrically isolated from the channel by a thin layer of gate oxide. Current through the channel is controlled by applying voltage to the conducting gate.

For a given device length, the amount of current drive for an FET is defined by the device width. Current drive scales proportionally to device width, with wider devices carrying more current than narrower devices. Different parts of integrated circuits (ICs) require the FETs to drive different amounts of current, i.e., with different device widths, which is particularly easy to accommodate in planar FET devices by merely changing the device gate width (via lithography).

With conventional planar FET scaling reaching fundamental limits, the semiconductor industry is looking at more unconventional geometries that will facilitate continued device performance improvements. One such class of devices is a FinFET.

SUMMARY

In one embodiment, the present invention provides a method of forming a finFET that does not include the traditional angled implants for providing the source/drain/extension/halo regions of the device. Traditionally, the formation of the source and drain regions of a prior finFET includes angled implants in order to ensure uniform doping along the fin sidewall at the gate/spacer edge. Unfortunately, when block masks are used to selectively dope the devices, i.e., finFET devices, of a first type conductivity, such as nFET, but not the devices of a second type conductivity, such as pFETs, the physical separation between the different types of devices that is required to avoid shadowing during implantation typically results in a density penalty, i.e., decreased density of devices for a given area of the substrate.

In one embodiment, the present invention provides a method of manufacturing a semiconductor device, such as a finFET, which includes the steps of:

providing a semiconductor fin structure atop a substrate;
forming a gate structure abutting the semiconductor fin structure;
forming a dielectric spacer abutting the gate structure, wherein each end of the semiconductor fin structure is exposed and the each end of the semiconductor fin structure extends a dimension that is less than about ¼ a length of the semiconductor fin structure from a sidewall of the gate structure;
implanting a dopant into each end of the semiconductor fin structure; and
forming a semiconductor region in electrical communication with the each end of the semiconductor fin structure.

The step of forming the gate structure abutting the semiconductor fin structure may include forming a gate dielectric layer abutting a portion of the fin semiconductor structure, forming a gate conductor layer in direct physical contact with the gate dielectric layer, etching the gate conductor layer to provide a gate stack positioned atop a channel region of the semiconductor fin structure, forming a spacer abutting the gate conductor, and etching the semiconductor fin structure. In one embodiment, the steps of etching the gate conductor layer and the semiconductor fin structure includes an anisotropic etch.

The step of forming the dielectric spacers abutting the gate structure may include depositing a dielectric material over the gate structure and etching the dielectric material to form spacers abutting the sidewall of the gate structure, wherein the each end of the semiconductor fin structure is exposed. In one embodiment, each end of the semiconductor fin structure extends a dimension of less than 20 nm from a sidewall of the gate structure. In one embodiment, an outer face of each end of the fin structure is substantially aligned to the sidewall of the gate structure.

In one embodiment, the implanting of the dopant into each end of the semiconductor fin structure, which can provide the source and drain regions, includes a tilt implant angle ranging from about 15° to about 45°, and a twist angle ranging from +7° to −7° with respect to the fin direction. The fin direction is the plane parallel to the width of the semiconductor fin structure.

The step of forming the semiconductor region to the each end of the semiconductor fin structure may include depositing polysilicon abutting the dielectric spacer and in electrical contact to the each end of the semiconductor fin structure, and implanting a dopant into the polysilicon. In one embodiment, a silicide is present atop the semiconductor region.

In another aspect the present invention, the present invention provides a semiconductor device including a fin structure, in which the fin structure may be characterized as a stub-fin structure. In one embodiment, a stub-fin structure is a fin structure in which each end of the fin structure extends a dimension that is less than about ¼ the length of the semiconductor fin structure, as measured from a sidewall of an overlying gate structure. Broadly, the semiconducting device includes:

at least one semiconductor fin structure atop the surface of a substrate, the fin structure including a channel of a first conductivity type and source/drain regions of a second conductivity type, the source/drain regions present at each end of the semiconductor fin structure;
a gate structure abutting the semiconductor fin structure;
a dielectric spacer abutting each sidewall of the gate structure wherein the each end of the fin structure extends a dimension that is less than about ¼ the length of the semiconductor fin structure from a sidewall of the gate structure; and
a semiconductor region to the each end of the semiconductor fin structure, wherein the semiconductor region to the each end of the semiconductor fin structure is separated from the gate structure by the dielectric spacer.

In one embodiment, each end of the semiconductor fin structure extends a dimension of less than 20 nm from a sidewall of the gate structure. In one embodiment, the outer face of the source/drain regions present at each end of the fin structure is substantially aligned to the sidewall of the dielectric spacer. In one embodiment, the gate structure includes a gate dielectric in direct physical contact with the channel of the fin structure, and a gate conductor in direct physical contact with the gate dielectric.

DETAILED DESCRIPTION OF THE DRAWINGS

The following detailed description, given by way of example and not intended to limit the invention solely thereto, will best be appreciated in conjunction with the accompanying drawings, wherein like reference numerals denote like elements and parts, in which.

Figure 2A:
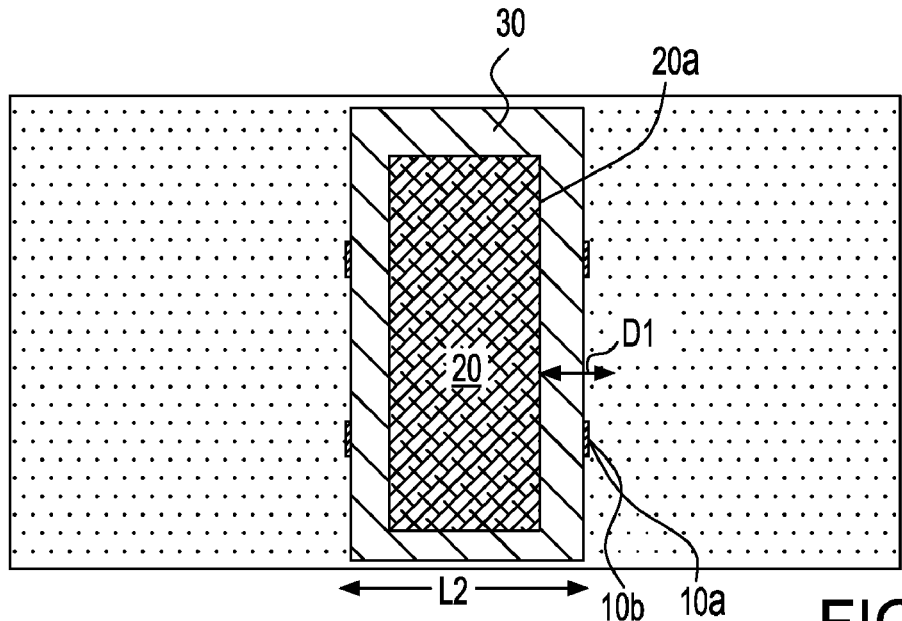
FIG. 2a is a top planar view depicting one embodiment of forming a dielectric spacer abutting the gate structure, wherein each end of the semiconductor fin structure extends a dimension that is less than ¼ a length of the semiconductor fin structure from a sidewall of the gate structure and wherein each end of the semiconductor fin structure is exposed, in accordance with the present invention.
Figure 2B:
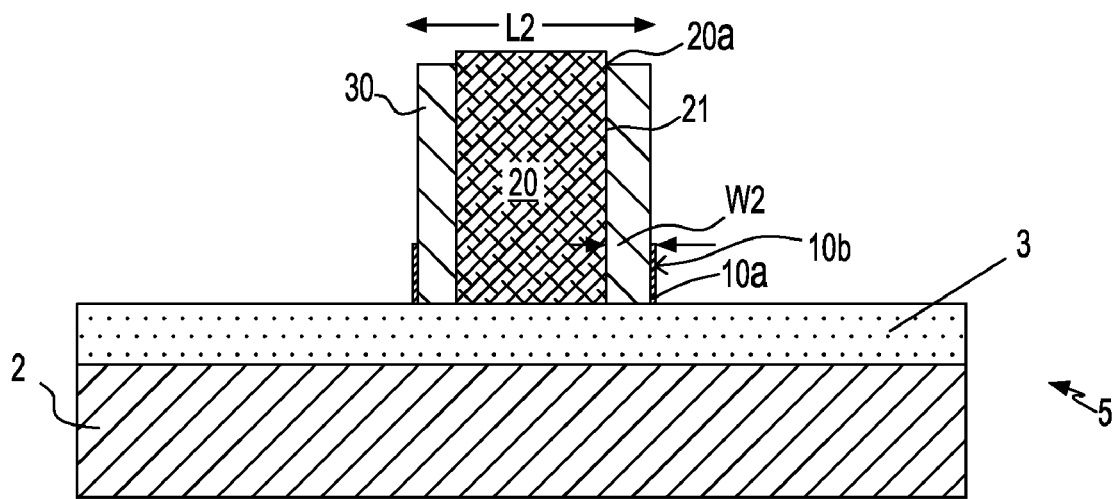

FIG. 2b is a side cross sectional view depicting one embodiment of forming a dielectric spacer abutting the gate structure, wherein each end of the semiconductor fin structure extends a dimension that is less than ¼ a length of the semiconductor fin structure from a sidewall of the gate structure and wherein each end of the semiconductor fin structure is exposed, in accordance with the present invention.

Figure 3A:
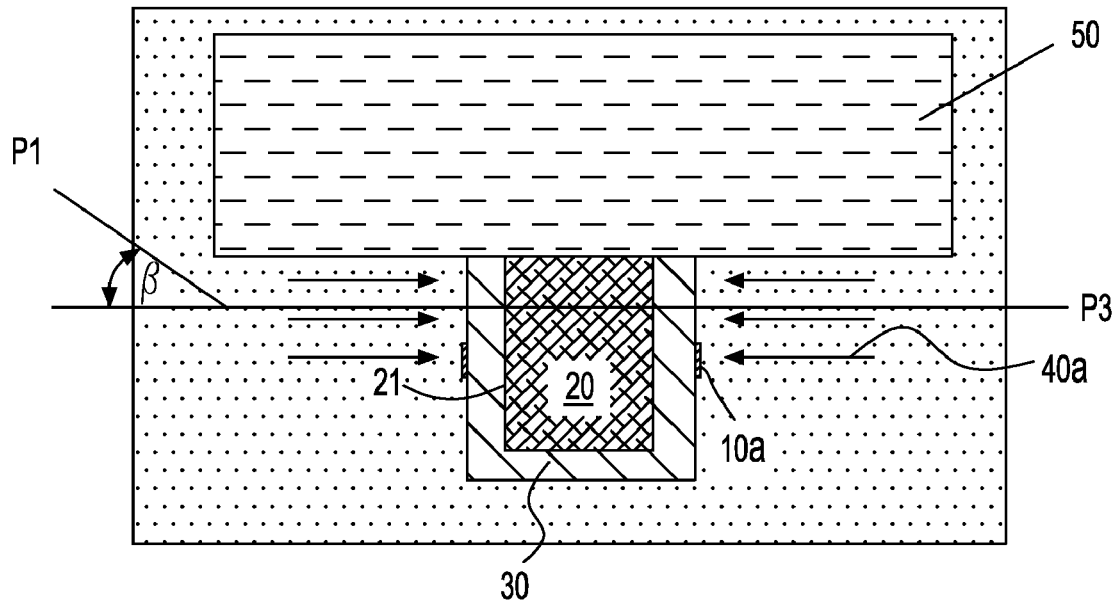

FIG. 3a is a top planar view depicting one embodiment of implanting a dopant into each end of the semiconductor fin structure of devices having a first conductivity type, i.e., nFET devices, while devices of a second conductivity type, i.e., pFET devices, are protected by a mask, in accordance with one embodiment of the present invention.

Figure 3B:
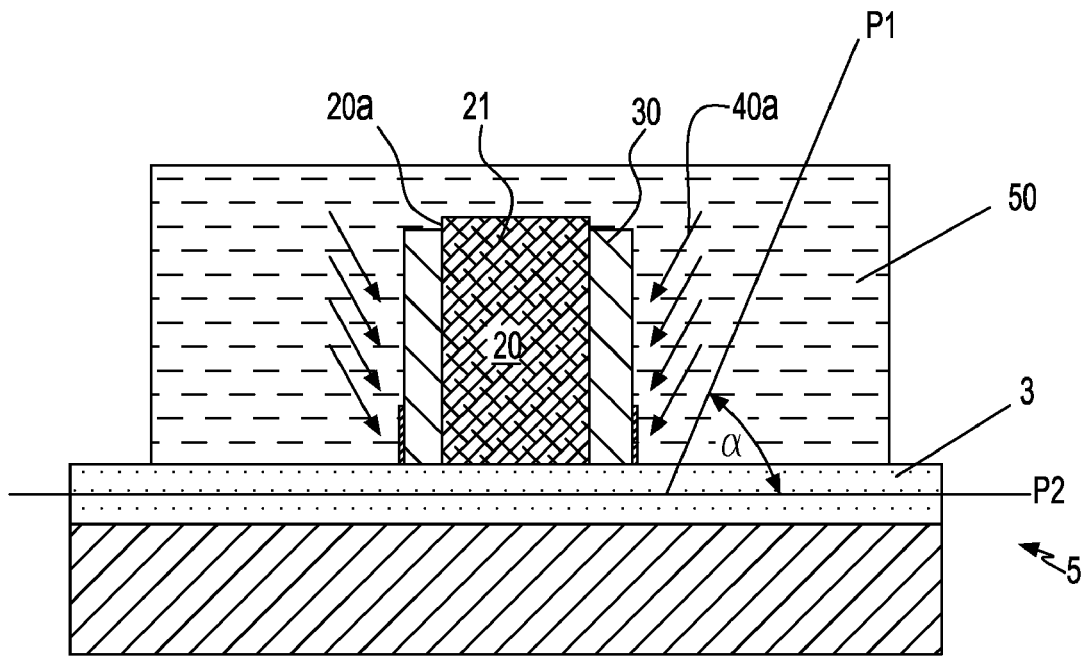

FIG. 3b is a side cross sectional view depicting one embodiment of implanting a dopant into each end of the semiconductor fin structure of devices having a first conductivity type, i.e., nFET devices, while devices of a second conductivity type, i.e., pFET devices, are protected by a mask, in accordance with one embodiment of the present invention.

Figure 4A:
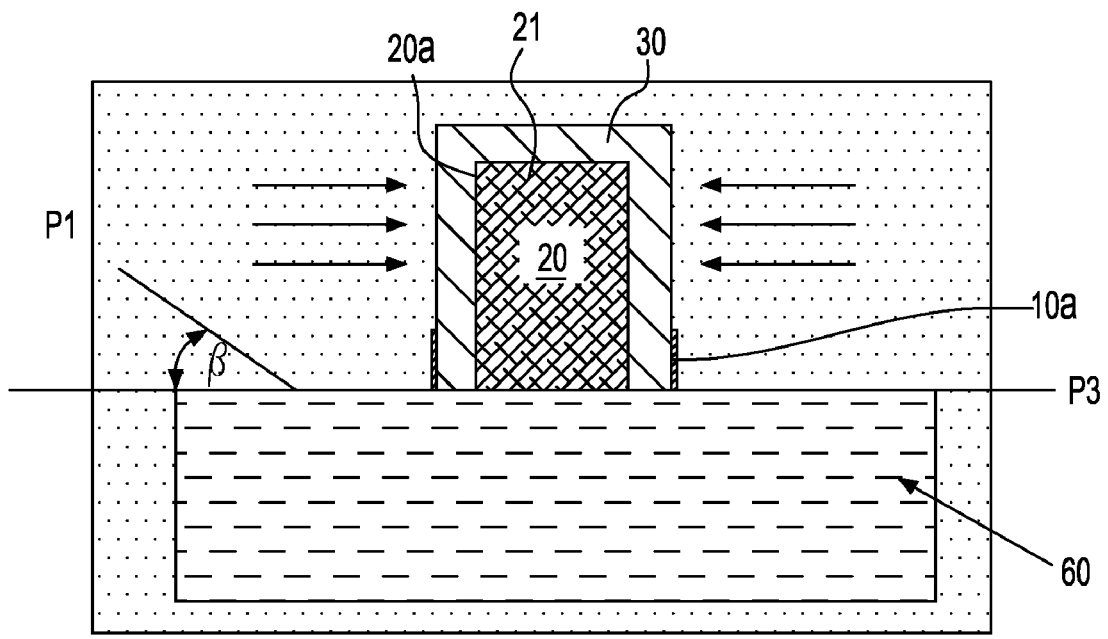

FIG. 4a is a top planar view depicting one embodiment of implanting a dopant into each end of the semiconductor fin structure of devices having the second conductivity type, i.e., pFET devices, while devices of the first conductivity type, i.e., nFET devices, are protected by a mask, in accordance with one embodiment of the present invention.

Figure 4B:
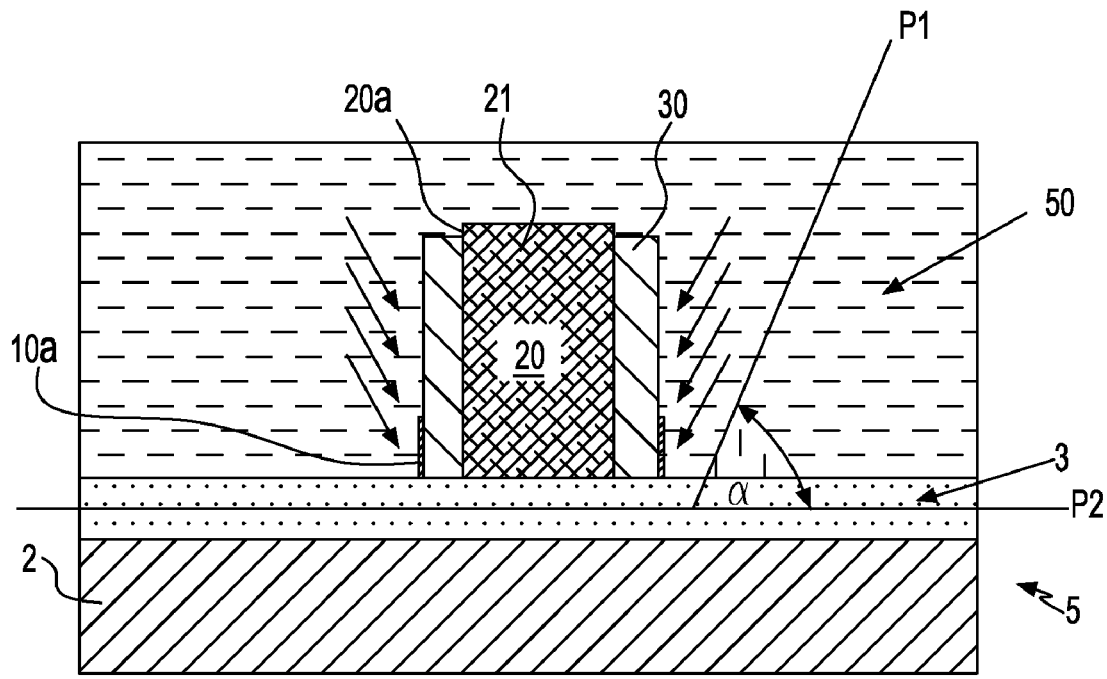

FIG. 4b is a side cross-sectional view depicting one embodiment of implanting a dopant into each end of the semiconductor fin structure of devices having the second conductivity type, i.e., pFET devices, while devices of the first conductivity type, i.e., nFET devices, are protected by a mask, in accordance with one embodiment of the present invention.

Figure 5A:
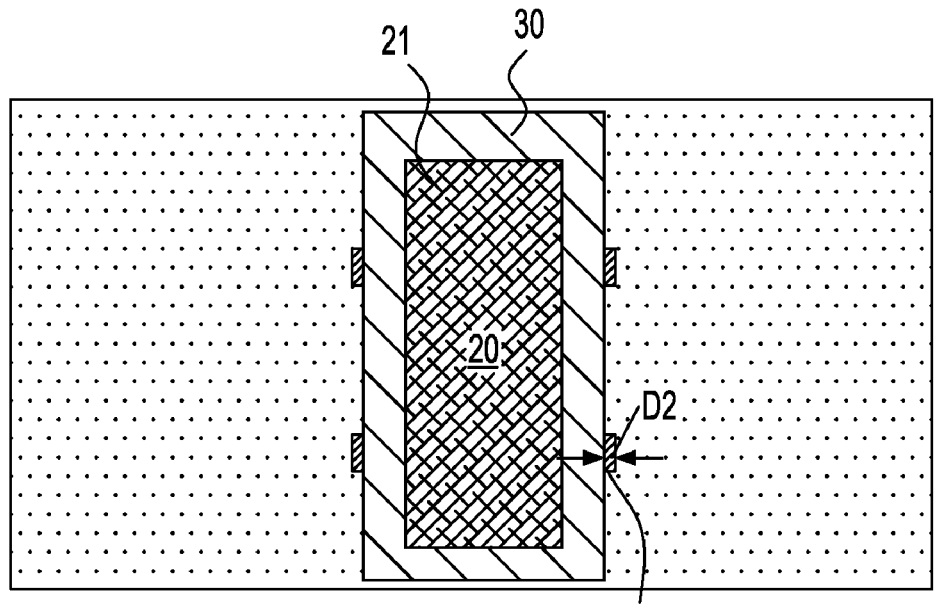

FIG. 5a is a top planar view depicting one embodiment of etching the spacer to expose a greater portion of the semiconductor fin structure, in accordance with one embodiment of the present invention.

Figure 5B:
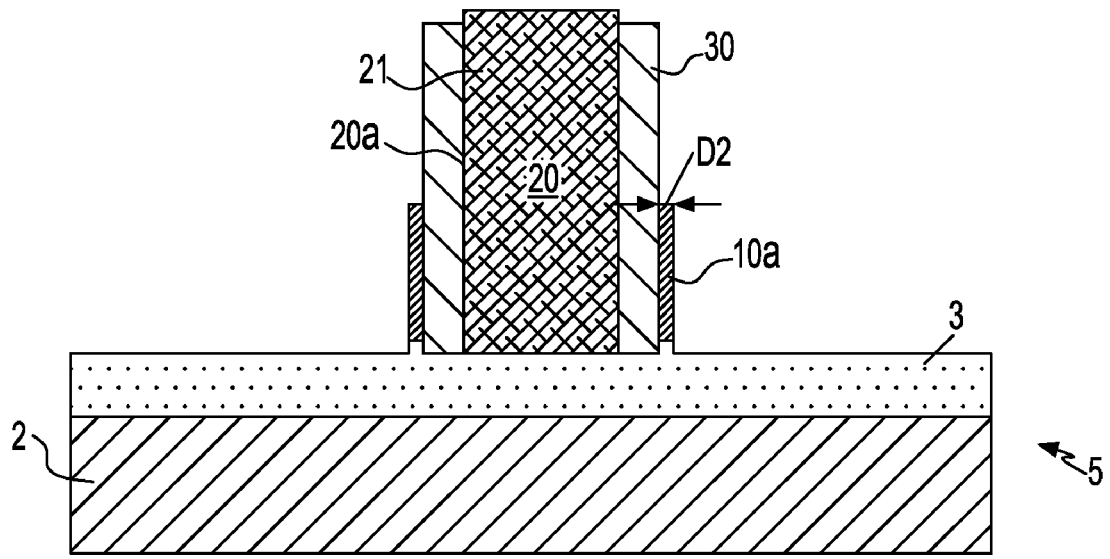

FIG. 5b is a side cross-sectional view depicting one embodiment of etching the spacer to expose a greater portion of the semiconductor fin structure, in accordance with one embodiment of the present invention.

Figure 6A:
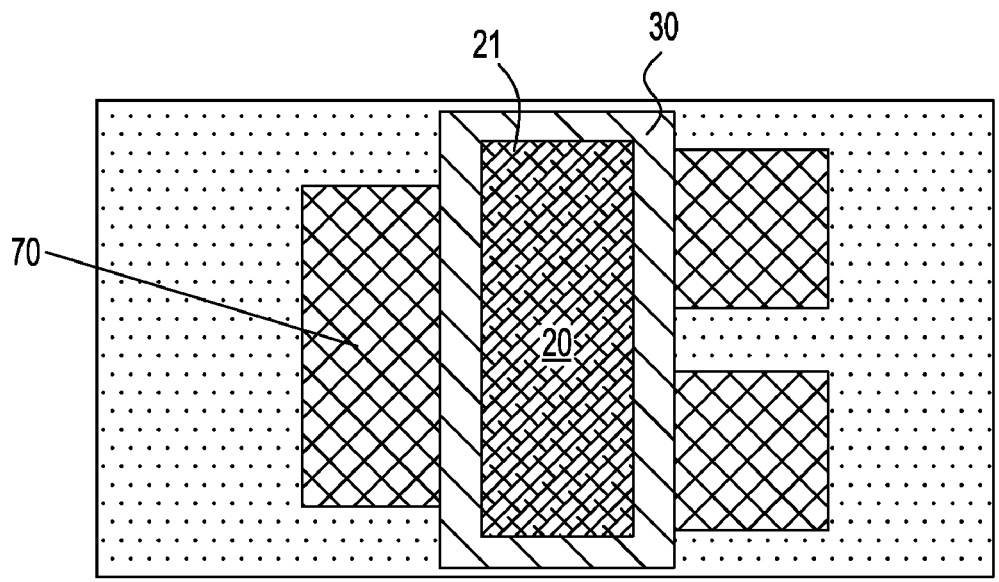

FIG. 6a is a top planar depicting one embodiment of forming a semiconductor region in electrical communication with the each end of the semiconductor fin structure, in accordance with the present invention.

Figure 6B:
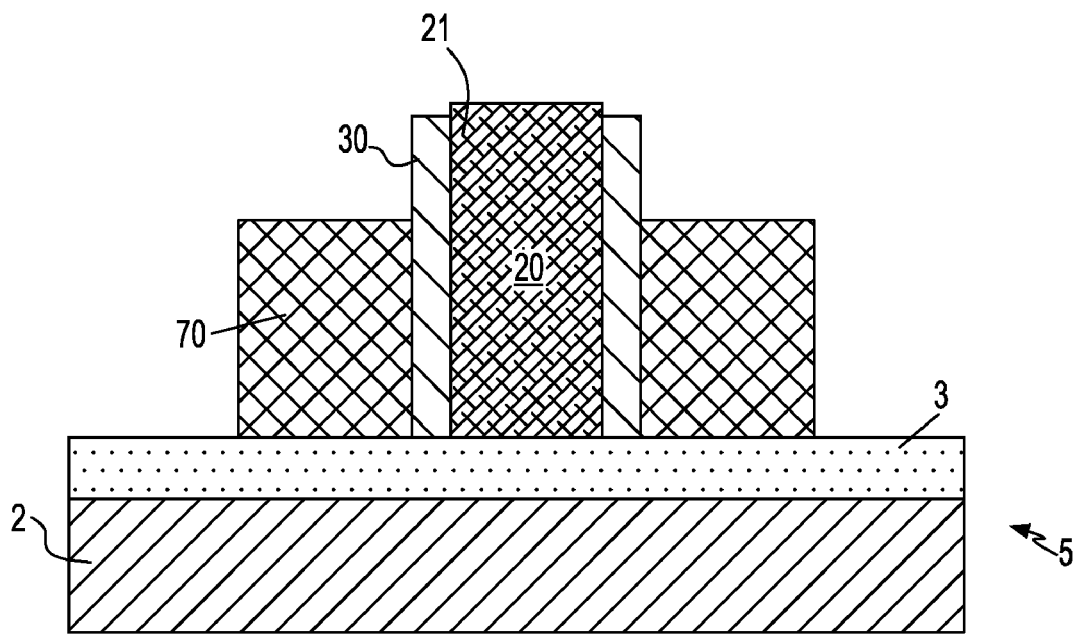

FIG. 6b is a side cross-sectional view depicting one embodiment of forming a semiconductor region in electrical communication with the each end of the semiconductor fin structure, in accordance with the present invention.

Figure 7A:
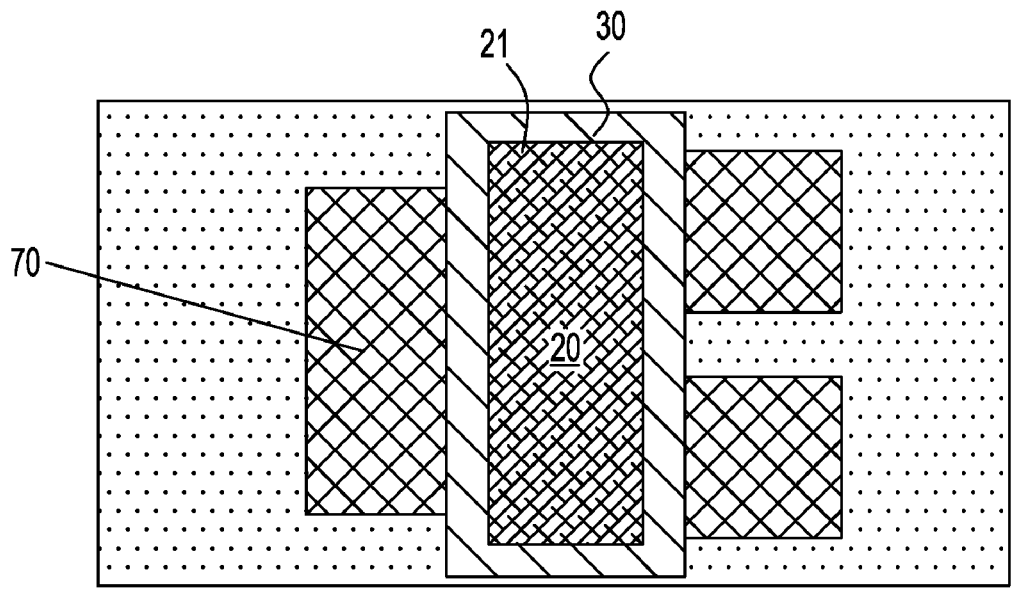

FIG. 7a is a top planar view depicting one embodiment of doping the semiconductor region, in accordance with the preset invention.

Figure 7B:
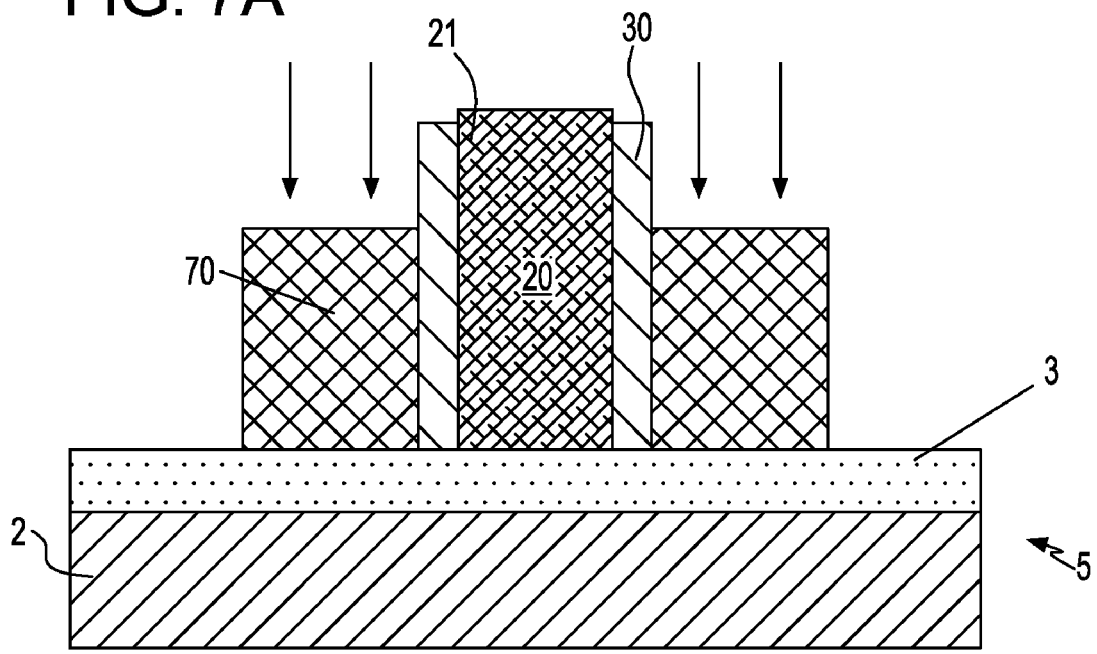

FIG. 7b is a side cross-sectional view depicting one embodiment of doping the semiconductor region, in accordance with the present invention.

Figure 8A:
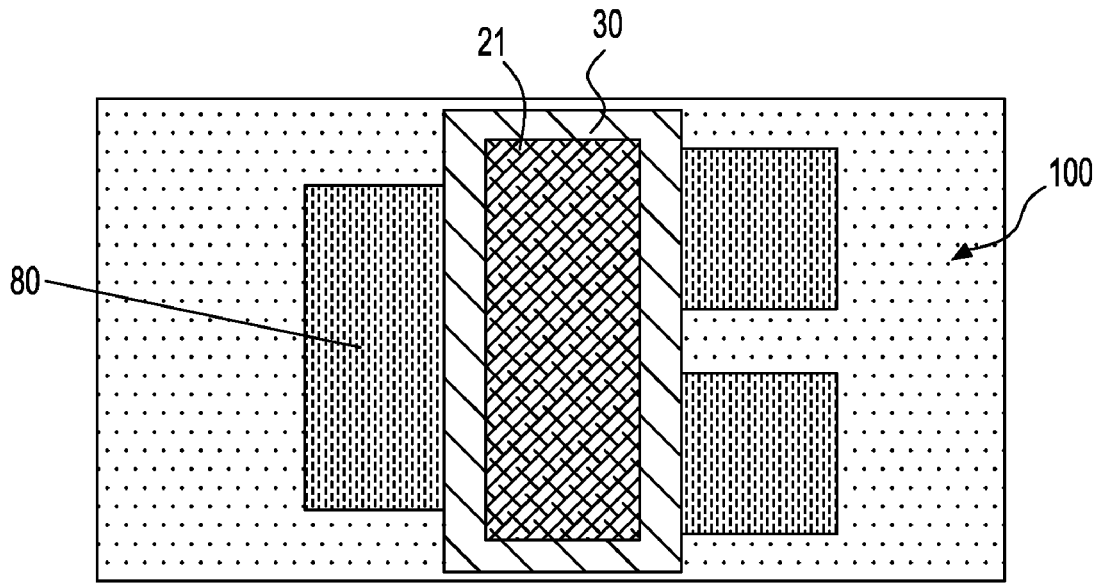

FIG. 8a is a top planar view depicting one embodiment of forming a silicide atop the semiconductor region, in accordance with the present invention.

Figure 8B:
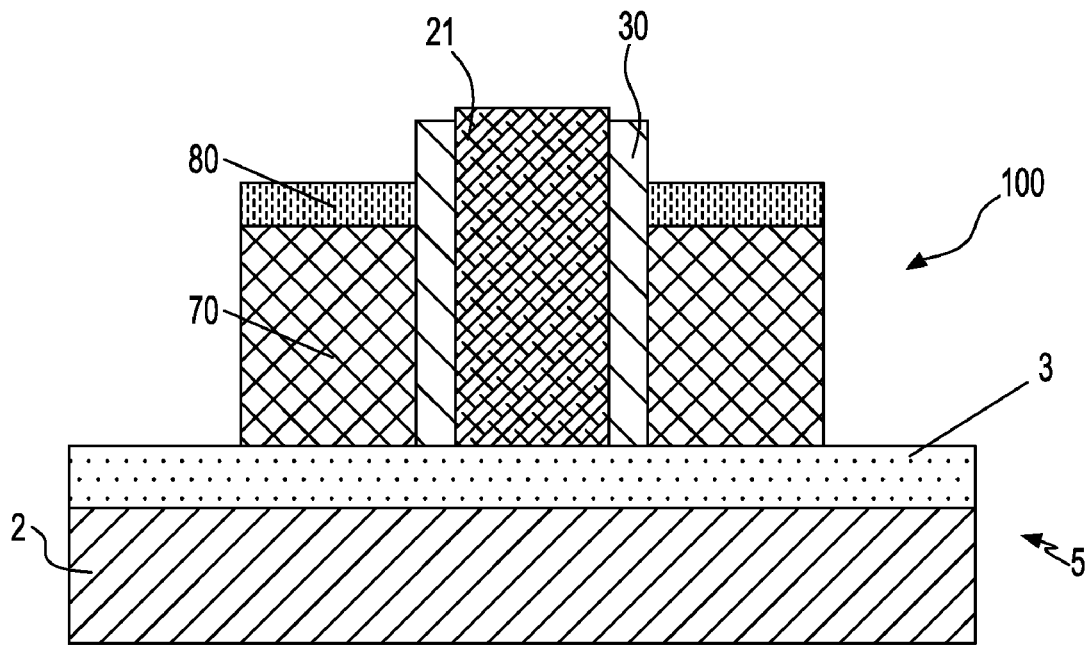

FIG. 8b is a side cross-sectional view depicting one embodiment of forming a silicide atop the semiconductor region, in accordance with the present invention.

DETAILED DESCRIPTION OF THE INVENTION

Detailed embodiments of the present invention are disclosed herein; however, it is to be understood that the disclosed embodiments are merely illustrative of the invention that may be embodied in various forms. In addition, each of the examples given in connection with the various embodiments of the invention are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the present invention.

The present invention relates to structures and methods for forming a semiconductor device. In one embodiment, the present invention relates to structures and methods for forming finFET semiconductor devices. When describing the following structures and methods, the following terms have the following meanings, unless otherwise indicated.

As used herein, "semiconductor" refers to an intrinsic semiconductor material that has been doped, that is, into which a dopant has been introduced, giving it different electrical properties than the intrinsic semiconductor. Doping involves adding dopant atoms to an intrinsic semiconductor, which changes the electron and hole carrier concentration of the intrinsic semiconductor at thermal equilibrium. Since dominant carrier concentrations in an extrinsic semiconductor classify it as either an n-type or p-type semiconductor.

As used herein, a "fin structure" refers to a semiconductor material, which is employed as the body of the FET, in which the dimension for the height of the body is greater than the width of the body.

The term "length" as used to describe the fin structure means the dimension that is parallel to the channel length of the device and extends from a first end of the fin structure to an opposing second end of the fin structure.

As used herein, the term "conductivity type" refers to a p-type or n-type semiconductor.

As used herein, a "P-type semiconductor" refers to the addition of trivalent impurities such as boron, aluminum or gallium to an intrinsic semiconductor substrate creates deficiencies of valence electrons.

As used herein, an "N-type semiconductor" refers to the addition of pentavalent impurities such as antimony, arsenic or phosphorous that contributes free electrons to an intrinsic semiconductor substrate.

A "gate structure" means a structure used to control output current (i.e. flow of carriers in the channel) of a semiconducting device through electrical or magnetic fields.

As used herein, the term "gate conductor" denotes a conductive material of the gate structure that is present overlying the gate dielectric.

The "gate dielectric" is a dielectric material of the gate structure and separates the gate conductor from a channel region of the semiconductor substrate.

A "silicide" is an alloy of a metal and silicon.

As used herein, the terms "dielectric", "insulating" or "insulating properties" denotes a material having a room temperature conductivity of less than about $10^{-10}$ $(\Omega\text{-m})^{-1}$.

As used herein, the term "conductive" denotes a material having a room temperature conductivity of greater than about $10^{-8}$ $(\Omega\text{-m})^{-1}$.

For purposes of the description hereinafter, the terms "upper", "lower", "right", "left", "vertical", "horizontal", "top", "bottom", and derivatives thereof shall relate to the invention, as it is oriented in the drawing figures.

"Abutting" means that at least one surface, such as a sidewall, or a first structure contacts a surface, such as a sidewall, of a second structure.

Further, it will be understood that when an element as a layer, region or substrate is referred to as being "on" or "atop" or "over" or "overlying" or "below" or "underlying" another element, it can be directly on the other element or intervening elements may also be present. In contrast, when an element is referred to as being "directly on" or "directly over" of in "direct physical contact" with another element, there are no intervening elements present.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

FIGS. 1a-8b depict one embodiment of forming a semiconducting device, such as finFET device 100. The present invention may provide a finFET device 100 including n-type and p-type conductivity finFETs. The inventive method of forming a finFET 100 may begin with providing a semiconductor fin structure 10 atop a substrate 5 and forming a gate structure 20 abutting the semiconductor fin structure 10. In a following process step, a dielectric spacer 30 is formed abutting the gate structure 20, wherein each end 10a of the semiconductor fin structure 10 is exposed, and the each end 10a of the semiconductor fin structure 10 extends a dimension that is less than about ¼ a length of the semiconductor fin structure 10 from a sidewall 20a of the gate structure 20. Thereafter, a dopant 40a is implanted into each end 10a of the semiconductor fin structure 10 and a semiconductor region 70 is formed in electrical communication with the each end of the semiconductor fin structure 10.

Figure 1A:
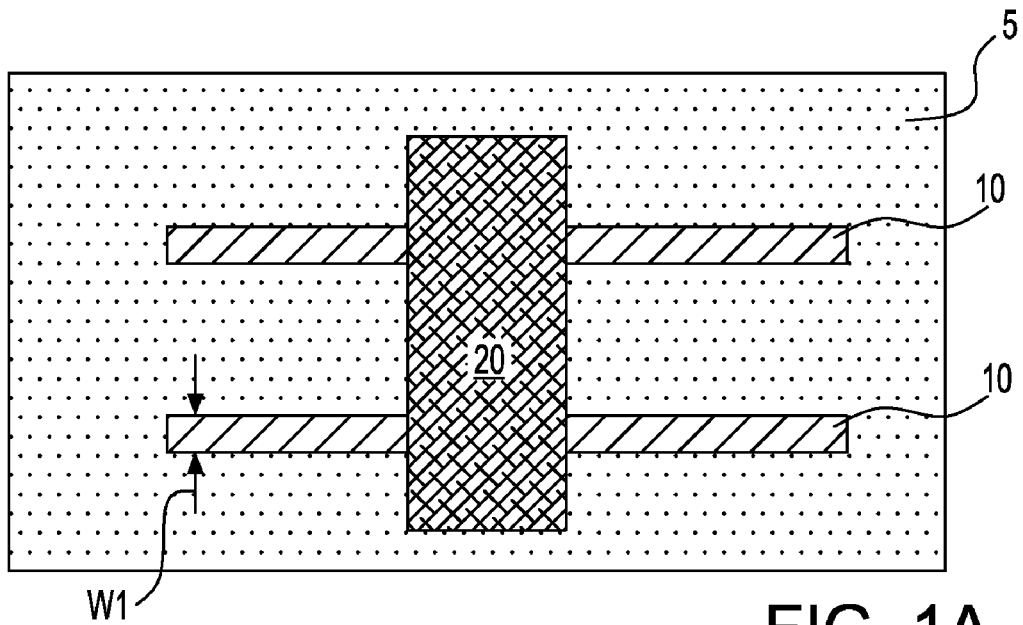
FIG. 1a is a top planar view of an initial structure used in one embodiment of a method for forming a finFET device, in accordance with the present invention.
Figure 1B:
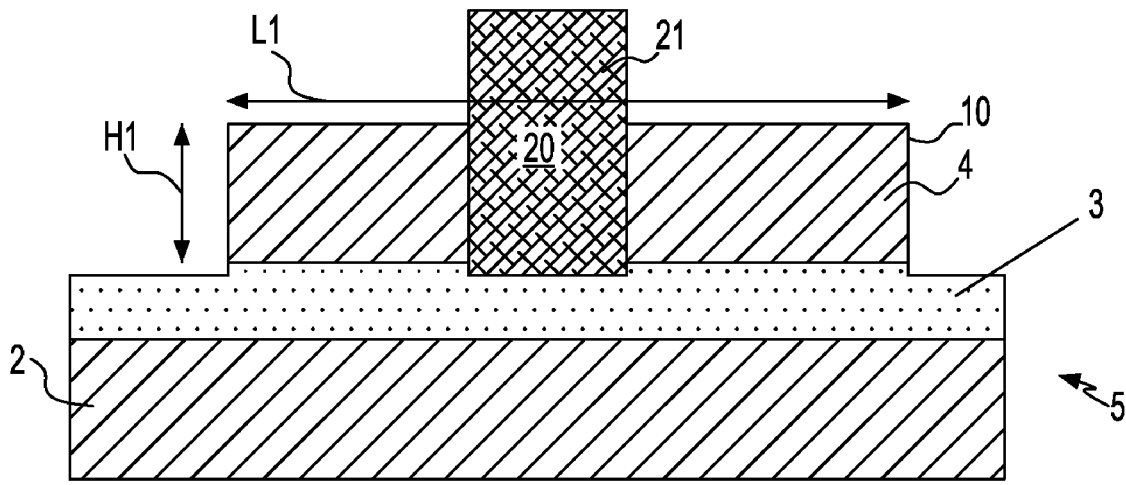
FIG. 1b is a side cross sectional view of an initial structure used in one embodiment of a method for forming a finFET device, in accordance with the present invention.

FIGS. 1A and 1B depict an initial structure used in one embodiment of a method for forming a finFET device. The initial structure may include a substrate 5, a semiconductor fin structure 10, and a gate structure 20.

The substrate 5 may be an SOI substrate. An SOI substrate typically includes a bottom semiconductor layer 2 and an upper semiconductor layer 4 (i.e., active semiconductor layer, which is also referred to as an SOI layer 4) that are electrically isolated from each other by a buried insulating layer 3. The upper semiconductor layer 4 and bottom semiconductor layer 2 may be comprised of one of Si, Ge alloys, SiGe, GaAs, InAs, InP, SiCGe, SiC, as well as other III/V or II/VI compound semiconductors. The buried insulating material 3 separating the two semiconducting layers 2, 4 may be a crystalline or non-crystalline oxide or nitride, or may be a doped or damaged semiconductor layer.

The SOI substrate employed in the present invention may be formed utilizing conventional processing techniques well known in the art. For example, a layer transfer process including a bonding step can be used in providing the SOI substrate. In one embodiment, an implantation process such as SIMOX (Separation by IMplantation of OXygen) can be used in forming the SOI substrate.

The thickness of the various layers of the SOI substrate may vary depending on the technique used in forming the same. In one embodiment, the upper semiconductor layer 4 has a thickness from about 3 nm to about 100 nm, the buried insulating layer 3 has a thickness from about 10 nm to about 150 nm, and the thickness of the bottom semiconductor layer 2 of the SOI substrate is inconsequential to the present invention.

It is noted that although an SOI substrate is depicted and described in the following discussion, embodiments of the present invention have been contemplated that utilize a bulk semiconductor substrate. In another embodiment of the present invention, in which a bulk semiconductor substrate is used, the bulk semiconductor substrate comprises one of Si, Ge alloys, SiGe, GaAs, InAs, InP, SiCGe, SiC as well as other III/V or II/VI compound semiconductors.

In one embodiment, the semiconductor fin structure 10 may be formed from the upper semiconductor layer 4, i.e., the SOI layer, of the SOI substrate using photolithography and etching. For example, a patterned photomask may be positioned overlying the SOI substrate by depositing a blanket layer of photoresist material on the surface of the upper semiconductor layer 4 utilizing a deposition process such as, for example, CVD, PECVD, evaporation or spin-on coating. In a following process step, the blanket layer of photoresist material is patterned into a patterned photomask by utilizing a lithographic process that may include exposing the photoresist material to a pattern of radiation and developing the exposed photoresist material utilizing a resist developer.

In one embodiment, with the patterned photomask in place, the exposed portion of the upper semiconductor layer 4 is removed from utilizing one or more etching processes, such as an anisotropic etch process, wherein the portions of the upper semiconductor layer 4 underlying and protected by the patterned photomask remain to provide the semiconductor fin structure 10. As used herein, an anisotropic etch process denotes a material removal process in which the etch rate in the direction normal to the surface to be etched is much higher than in the direction parallel to the surface to be etched. The one or more etching processes may include dry etching or wet etching. In one example of dry etching that is suitable for use with the present invention is reactive-ion etching (RIE). Reactive Ion Etching (RIE) is a form of plasma etching in which during etching the surface to be etched is placed on the RF powered electrode, wherein the surface to be etched takes on a potential that accelerates the etching species extracted from a plasma toward the surface, in which the chemical etching reaction is taking place in the direction normal to the surface. Other examples of dry etching that can be used at this point of the present invention include ion beam etching, plasma etching or laser ablation. After the exposed portion of the upper semiconductor layer 4 are removed to provide the semiconductor fin structure 10, the patterned photomask is removed utilizing a resist stripping process.

In one embodiment, the semiconductor fin structure 10 has a length L1 ranging from about 5 nm to about 160 nm. In another embodiment, the semiconductor fin structure 10 has a length L1 ranging from about 8 nm to about 80 nm. In an even further embodiment, the semiconductor fin structure 10 has a length L1 ranging from about 8 nm to about 25 nm.

In one embodiment, the semiconductor fin structure 10 has a height H1 ranging from about 5 nm to about 100 nm. In another embodiment, the semiconductor fin structure 10 has a height H1 ranging from about 10 nm to about 50 nm. In an even further embodiment, the semiconductor fin structure 10 has a height H1 ranging from about 20 nm to about 60 nm.

In one embodiment, the semiconductor fin structure 10 has a width W1 ranging from about 3 nm to about 80 nm. In another embodiment, the semiconductor fin structure 10 has a width W1 ranging from about 4 nm to about 25 nm. In an even further embodiment, the semiconductor fin structure 10 has a width W1 ranging from about 4 nm to about 15 nm.

At this point of the method, the semiconductor fin structure 10 may be doped (i.e., channel doped or well doped). For example, an ion implantation process can be used to implant dopant ions, such as p- or n-type dopants, into the semiconductor fin structure 10. The semiconductor fin structure 10 may also be doped epitaxially.

Still referring to FIGS. 1A and 1B, in one embodiment, the gate structure 20 includes at least one gate conductor 21 and at least one gate dielectric (not shown), wherein the gate dielectric is positioned between the gate conductor 21 and the semiconductor fin structure 10. In one embodiment, the gate structure 20 is formed abutting the semiconductor fin structure 10, wherein the gate structure 20 is in direct physical contact with the sidewalls and top surface of the semiconductor fin structure 10. In one embodiment, the gate dielectric is present in direct physical contact with the sidewalls and top surface of the semiconductor fin structure 10, and the gate conductor 21 is in direct physical contact with the gate dielectric, wherein the gate dielectric separates the gate conductor 21 from the semiconductor fin structure 10. The gate dielectric and gate conductor 21 are positioned around the semiconductor fin structure 10 such that charge flows down the channel on the two sides of the semiconductor fin structure 10 and optionally along the top surface.

In one embodiment, the gate dielectric is formed first, followed by the gate conductor 21. Specifically, in one example, the gate dielectric is formed by first providing a sacrificial oxide (not shown) on the structure and then stripping the sacrificial oxide to remove imperfections in the structure. The gate dielectric is then formed using a thermal growth process, such as, for example, oxidation, nitridation or oxynitridation. The gate dielectric can also be formed by a deposition process such as, for example, chemical vapor deposition (CVD), plasma-assisted CVD, metal organic chemical vapor deposition (MOCVD), atomic layer deposition (ALD), evaporation, reactive sputtering, chemical solution deposition and other like deposition processes. The gate dielectric may also be formed utilizing any combination of the above processes.

In one embodiment, the gate dielectric is composed of an insulating material having a dielectric constant of about 4.0 or greater. In another embodiment, the gate dielectric is composed of an insulating material having a dielectric constant greater than 7.0. The dielectric constants mentioned herein are relative to a vacuum. It is noted that $SiO_2$ typically has a dielectric constant that is about 4.0. The gate dielectric employed in the present invention may include, but is not limited to: an oxide, nitride, oxynitride and/or silicates including metal silicates, aluminates, titanates and nitrides. In one embodiment, the gate dielectric is comprised of an oxide such as, for example, $SiO_2$, $HfO_2$, $ZrO_2$, $Al_2O_3$, $TiO_2$, $La_2O_3$, $SrTiO_3$, $LaAlO_3$, $Y_2O_3$ and mixture thereof. The physical thickness of the gate dielectric may vary, but typically, the gate dielectric has a thickness from about 1 nm to about 10 nm. In another embodiment, the gate dielectric has a thickness from about 1 nm to about 3 nm.

After forming the gate dielectric, a blanket layer of a conductive material which forms the gate conductor 21 of gate structure 20 is formed on the gate dielectric utilizing a known deposition process, such as physical vapor deposition (PVD), CVD or evaporation. The conductive material may comprise polysilicon, SiGe, a silicide, a metal or a metal-silicon-nitride such as Ta—Si—N. Examples of metals that can be used as the conductive material include, but are not limited to: Al, W, Cu, Ti or other like conductive metals. The blanket layer of conductive material may be doped or undoped. If doped, an in-situ doping deposition process may be employed. Alternatively, a doped conductive material can be formed by deposition, ion implantation and annealing.

In one embodiment, the doping of the conductive material will shift the workfunction of the gate formed. Illustrative examples of doping ions include As, P, B, Sb, Bi, In, Al, Tl, Ga or mixtures thereof. The thickness, i.e., height, of the conductive material deposited at this point of the present invention may vary depending on the deposition process employed. In one embodiment, the conductive material has a vertical thickness from about 20 nm to about 180 nm. In another embodiment, the conductive material has a vertical thickness from about 40 nm to about 150 nm.

In some embodiments, an optional hardmask (not shown) may be formed atop the conductive material utilizing a conventional deposition process. The optional hardmask can be composed of a dielectric such as an oxide or nitride.

After deposition of at least the gate dielectric and the conductive material, gate structures 20 including the gate conductor 21 are formed. In one embodiment, the gate structures 20 are formed by first providing a patterned mask atop the conductive material by deposition and lithography and then transferring the pattern to the conductive material and the gate dielectric using one or more etching processes, such as RIE. The region of semiconductor fin structure 10 in which the gates cross over is the channel region.

Referring to FIGS. 2a and 2b, in a following processing step, a dielectric spacer 30 is formed abutting the gate structure 20 and overlying a portion of the semiconductor fin structure 10. The dielectric spacer 30 is in direct contact with the perimeter of the gate structure 20 as is shown, for example, in FIG. 2a, and abuts the sidewall of the gate structure 20 as is shown, for example, in FIG. 2b. In one embodiment, the dielectric spacer 30 is formed by a deposition process, such as, for example, CVD or PECVD, followed by an anisotropic etching process, such as, for example RIE.

In one embodiment, the dielectric that provides the dielectric spacer 30 is an oxide, such as silicon oxide. In another embodiment the dielectric that provides the dielectric spacer 30 may be a nitride, such as silicon nitride, or an oxynitride, such as SiON.

The dielectric that provides the dielectric spacer 30 is first deposited atop at least the semiconductor fin structure 10 abutting the gate structure 20. In one embodiment, the dielectric may be blanket deposited atop the structure depicted in FIGS. 1a and 1b, using a deposition process, such as chemical vapor deposition (CVD) or physical vapor deposition (PVD). Chemical vapor deposition is a deposition process in which a deposited species is formed as a results of chemical reaction between gaseous reactants at greater than room temperature (25° C. to 600° C.); wherein solid product of the reaction is deposited on the surface on which a film, coating, or layer of the solid product is to be formed. Variations of CVD processes include, but not limited to, Atmospheric Pressure CVD (APCVD), Low Pressure CVD (LPCVD) and Plasma Enhanced CVD (EPCVD), Metal-Organic CVD (MOCVD) and combinations thereof may also be employed.

Following the deposition of the dielectric layer, an anisotropic etch step may be utilized to form the dielectric spacer 30 from the dielectric layer. In one embodiment, an etch mask may be employed to protect the portion of the dielectric layer that is to remain in providing the dielectric spacer 30, wherein an exposed portion of the dielectric is removed. The etch mask may be provided by a photoresist, or may be a hard mask, such as a hard mask composed of an oxide, nitride or oxynitride. In another embodiment, the etch mask may be provided by an overhanging feature of the gate structure 20.

In one embodiment, following the formation of the etch mask, an etch process removes the exposed portion of dielectric that is not underling the etch mask, while the portion of the dielectric underlying the etch mask remains to provide the dielectric spacer 30. The exposed portion of the dielectric may be removed by an anisotropic etch step. In one embodiment, the anisotropic etch process may be provided by reactive ion etch. Other examples of dry etching that can be used at this point of the present invention include ion beam etching, plasma etching or laser ablation. In one embodiment, the etch chemistry for removing the exposed portions of the dielectric may remove the dielectric selective to the semiconductor fin structure 10 or the buried insulating layer 3 of the SOI substrate.

In one embodiment, the dielectric spacer 30 has a width W2 ranging from about 1 nm to about 150 nm. In another embodiment, the dielectric spacer 30 has a width W2 ranging from about 1 nm to about 30 nm. In an even further embodiment, the dielectric spacer 30 has a width W2 ranging from about 2 nm to about 10 nm.

Following the formation of the dielectric spacer 30, the exposed portions of the semiconductor fin structure 10 that are not protected by the dielectric spacer 30 and the gate structure 20 are removed by an etch process. In one embodiment, the etch process is a selective etch process. As used herein, the term "selective" in reference to a material removal process denotes that the rate of material removal for a first material is greater than the rate of removal for at least another material of the structure to which the material removal process is being applied. In one embodiment, the exposed portions of the semiconductor fin structure 10 are removed during the etch process that forms the dielectric spacer 30, wherein the etch process may be selective to the underlying substrate 5. The etching process for removing the exposed portions of the semiconductor fin structure 10 may be an anisotropic etch process, such as reactive ion etch.

Following etching of the portion of the semiconductor fin structure 10 that is not protected by the dielectric spacers 30, each end 10a of the semiconductor fin structure 10 extends a dimension D1 that is less than about ¼ the length L2 of the semiconductor fin structure 10 from a sidewall 20a of the gate structure 20. In another embodiment, each end 10a of the semiconductor fin structure 10 extends a dimension that is equal to or less than the width W1 of the semiconductor fin structure 10 from a sidewall 20a of the gate structure 20.

The portion of the semiconductor fin structure 10 that extends from the sidewall 20a of the gate structure 20 may be equal to the width W2 of the dielectric spacer 30. In one embodiment, the portion of the semiconductor fin structure that extends from the sidewall 20a of the gate structure 20 is less than 20 nm. In one embodiment, the portion of the semiconductor fin structure 10 that is exposed at this point of the process is the face 10b of the end 10a of the semiconductor fin structure 10, as depicted in FIGS. 2a and 2b. In one embodiment, the outer face 10b of each end 10a of the semiconductor fin structure 10 is substantially aligned to the sidewall 20a of the gate structure 20.

FIGS. 3a and 3b, depict one embodiment of implanting a dopants into each end 10a of the semiconductor fin structure 10 that is present in a first portion of the semiconducting substrate 5 to provide devices having a first conductivity type, i.e., n-type semiconducting devices, such as nFET semiconducting devices, while devices of a second conductivity type, i.e., p-type semiconducting devices, such as pFET semiconducting devices, are protected by a mask 50.

The mask 50 may be provided using deposition, photolithography and development process steps. More specifically, in one embodiment, a layer of photoresist is deposited atop the entire structure and the layer of photoresist is then selectively exposed to light and developed to pattern a block mask 50, wherein the block mask 50 is positioned protecting at least one region of the substrate and exposing at least a second region of the substrate. The exposed regions of the device may then be processed, while the regions underlying the block mask are protected. For example, in one embodiment, as depicted in FIGS. 3a and 3b, the block mask 50 may be formed atop the portion of the substrate 5 containing the gate structure 20 and the fin structure 10 that is subsequently processed to provide p-type semiconducting devices, while a second portion of the substrate 5 is exposed in which at least one of the exposed gate structure 20 and the exposed fin structure 10 are subsequently processed to provide n-type semiconducting devices.

Following the formation of the block mask 50, the source/drain extension regions (not shown) and/or halo regions (not shown) are formed into the exposed edge 10a of the semiconductor fin structure 10 utilizing an implantation process. In one embodiment, implanting the dopant into each end 10a of the semiconducting fin structure 10 comprises a tilt implant angle $\alpha$ ranging from about 35° to about 75° and a twist angle $\beta$ ranging from +7° to −7° with respect to the fin direction. The tilt implant angle $\alpha$ is defined as the acute angle at the intersection of the plane parallel P1 to the direction the implant dopant travels towards each end 10a of the semiconducting fin structure 10 and the plane P2 parallel to the width of the substrate 5. The twist implant angle $\beta$ is defined as the acute angle at the intersection of the plane parallel P1 to the direction the implant dopant travels towards each end 10a of the semiconducting fin structure 10 and the plane P3 parallel to the length L1 of the semiconducting fin structure 10. In another embodiment, the tilt implant angle $\alpha$ ranging from about 45° to about 70° and a twist angle ranging from +3° to −3°.

For example, in one embodiment, a low energy ion implant process (on the order of 1 KeV or less) is used to implant extension implants diffusions for the finFET region 10. In one embodiment, in which the semiconductor fin structure 10 that are exposed by the block mask 50 is implanted to provide nFET devices, semiconductor Fin structure 10 is implanted using boron or indium for the optional halo implant, and arsenic for the nFET extension.

Following the implantation of the first portion of the semiconducting substrate 5 to provide devices having a first conductivity type, i.e., n-type semiconducting devices, the block mask 50 is removed from the second portion of the semiconductor substrate 5 using a stripping process, such as oxygen ashing. The resist mask may also be removed using a solvent stripping process.

FIGS. 4a and 4b, depict one embodiment of implanting a dopants into each end 10a of the semiconductor Fin structure 10 that is present in a second portion of the semiconducting substrate 5 to provide devices having a second conductivity type, i.e., p-type semiconducting devices, such as pFET semiconducting devices, while the portions of the semiconductor fin structure 10 that are present in the first portion of the semiconducting substrate 5 are protected by a block mask 60. The implant process for the portions of the semiconductor fin structure 10 that is present in the second portion of the semiconducting substrate are similar to the implant process utilized to implant the semiconductor Fin structure 10 that is present in the first portion of the semiconducting substrate 5. For example, an implant for a p-type device may be boron or $BF_2$, if the FinFET is a p-type device. The block mask 60 may be removed using a solvent stripping process or by using an oxygen ash process.

FIGS. 5A and 5B depict one embodiment of etching the dielectric spacer 30 to expose each end 10a of the Si-containing fin structure 10. In one embodiment, the etching may be referred to as a dielectric spacer etch back. In one embodiment, the dielectric spacer etch back may include a wet etch chemistry. In one embodiment, the dielectric spacer etch back includes an isotropic etch process. In one embodiment, the dielectric spacer etch back includes an etch process that removes the dielectric spacer 30 material selective to the semiconductor Fin structure 10. In one embodiment, when the dielectric spacer 30 is composed of an oxide, such as silicon oxide, and the semiconductor Fin structure 10 is composed of a Si-containing material, such as polysilicon, the etch chemistry may include fluorocarbons. It is noted that other etch chemistries have been contemplated so long as the etch process removes the dielectric spacer 30 material selective to the semiconductor Fin structure 10.

In one embodiment, the dielectric spacer etch back exposes a greater portion of the edges 10a of the semiconductor fin structure 10. In one embodiment, the exposed portion of the edges 10a of the semiconductor fin structure 10 may extend a dimension D2 ranging from 1 nm to about 80 nm from the sidewall of the dielectric spacer 30 that has been etched with the dielectric etch back process. In another embodiment, the exposed portion of the edges 10a of the semiconductor fin structure 10 may extend a dimension D2 ranging from 2 nm to about 40 nm from the sidewall of the dielectric spacer 30 that has been etched with the dielectric etch back process. In a further embodiment, the exposed portion of the edges 10a of the semiconductor fin structure 10 may extend a dimension D2 ranging from about 2 nm to about 12 nm from the sidewall of the dielectric spacer 30 that has been etched with the dielectric etch back process.

Referring to FIGS. 6A and 6B, in a following process step, semiconductor regions 70 are formed in contact with each exposed portion 10b of the edges 10a of the semiconductor fin structure 10. In one embodiment, the semiconductor regions 70 may be formed using deposition, photolithography and etch processes.

The semiconductor regions 70 may be composed of Si, polysilicon, strained Si, $Si_{1-y}C_y$, $Si_{1-x-y}$, $Ge_xC_y$, $Si_{1-x}Ge_x$, Si alloys, Ge, Ge alloys, GaAs, InAs, InP as well as other III-V and II-VI semiconductors. The semiconducting regions 70 may be formed using deposition processes including, but not limited to chemical vapor deposition. In another embodiment, the semiconductor regions 70 may be formed using epitaxial growth. In yet another embodiment, the semiconductor regions may be formed using a combination of deposition and epitaxial growth.

In one embodiment, a blanket layer of semiconductor material for the semiconductor regions 70 may be deposited atop the structure depicted in FIGS. 5A and 5B. In an following process, the blanket layer of the semiconducting material may be patterned and etched to provide the semiconductor regions 70 corresponding to the each exposed portion of the edges 10a of the semiconductor fin structure 10. More specifically, a patterned photomask may be formed atop the blanket layer of the semiconductor material, wherein the portions of the blanket layer of the semiconductor material underlying the patterned photomask are protected to provide the semiconducting regions 70, and the exposed portion of the blanket layer of the semiconductor material are removed. The remaining portions of the blanket layer of the semiconductor material provide the semiconductor regions 70.

Still referring to FIGS. 7A and 7B, in a following process step the semiconductor regions 70 are doped to correspond to the conductivity type of the exposed portion 10b of the edge 10a of the semiconducting Fin structure 10. In one embodiment, the semiconductor regions are doped via ion implantation. A p-type conductivity is produced in Si-containing semiconductor regions 70 by doping the semiconductor region 70 with group III-A elements of the periodic table of elements, such as B. An n-type conductivity is produced in Si-containing semiconductor regions 70 by doping the semiconductor region 70 with group V elements, such as P or As. In another embodiment, in which the semiconductor regions 70 are formed by epitaxial growth the dopant may be introduced during the growth process.

FIGS. 8A and 8B depict forming a contact 80 atop the semiconductor regions 70. In one embodiment, the contact 80 is a metal silicon alloy, which may also be referred to as a silicide. In one embodiment, the metal silicon alloy contact 80 may be formed atop the semiconductor regions 70 by depositing a refractory metal such as Ni or Ti onto the surface Si-containing surface of the semiconductor regions. The refractory metal may be deposited by physical vapor deposition (PVD), such as plating. Following deposition, the structure is then subjected to an annealing step using conventional processes such as, but not limited to, rapid thermal annealing. During thermal annealing, the deposited metal reacts with Si forming a metal silicon alloy.

In one embodiment, the finFet 100 provided by the present invention includes at least one semiconductor fin structure 10 atop the surface of a substrate 5; the fin structure 10 including a channel of a first conductivity type and source and drain regions 70 of a second conductivity type, the source and drain regions 70 present at each end of the semiconductor fin structure 10; a gate structure 20 abutting the semiconductor fin structure 10; a dielectric spacer 30 abutting each sidewall of the gate structure 20, wherein the each end of the semiconductor fin structure 10 extends a dimension D1 that is less than about ¼ the length of the semiconductor fin structure 10 from a sidewall of the gate structure; and a semiconductor region 70 to the each end of the semiconductor fin structure 10, wherein the semiconductor 70 to the each end of the semiconductor fin structure 10 is separated from the gate structure 20 by the dielectric spacer 30.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of manufacturing a semiconducting device comprising:

providing a semiconductor fin structure atop a substrate;

forming a gate structure immediately adjacent to the semiconductor fin structure;

forming a dielectric spacer immediately adjacent to the gate structure and over the semiconductor fin structure, wherein a sidewall at each end of the semiconductor fin structure is substantially aligned to an exterior sidewall of the dielectric spacer and is exposed, and wherein each end of the semiconductor fin structure extends a dimension that is less than about ¼ a length of the semiconductor fin structure from a sidewall of the gate structure;

implanting a dopant into each end of the semiconductor fin structure; and forming a semiconductor region in electrical communication with the each end of the semiconductor fin structure.

2. The method of claim 1, wherein the forming of the gate structure immediately adjacent to the Si containing fin structure comprises:

forming a gate dielectric layer immediately adjacent to a portion of the semiconductor fin structure;

forming a gate conductor layer immediately adjacent to the gate dielectric layer;

etching the gate conductor layer to provide a gate stack positioned atop a channel region of the semiconductor fin structure;

forming a spacer adjacent to the gate conductor; and etching the semiconductor fin structure.

3. The method of claim 2, wherein etching the gate conductor layer comprises an anisotropic etch.

4. The method of claim 2, wherein etching the semiconductor fin structure comprises an isotropic etch or an anisotropic etch.

5. The method of claim 1, wherein the forming of the dielectric spacers immediately adjacent to the gate structure comprises depositing a dielectric material over the gate structure and etching the dielectric material to form spacers abutting the sidewall of the gate structure.

6. The method of claim 5, wherein the each end of the semiconductor fin structure extends a dimension of less than 20 nm from a sidewall of the gate structure.

7. The method of claim 1, wherein the implanting the dopant into each end of the semiconductor fin structure comprises an tilt implant angle ranging from about 45° to about 75° and a twist angle ranging from +7° to −7° with respect to the fin direction.

8. The method of claim 7, wherein the implanting the dopant forms source/drain regions in the semiconductor fin structure.

9. The method of claim 1, wherein an outer face of each end of the semiconductor fin structure is substantially aligned to the sidewall of the gate structure.

10. The method of claim 1, wherein the forming of the semiconductor region to the each end of the semiconductor fin structure includes depositing polysilicon abutting the dielectric spacer and in electrical contact to the each end of the semiconductor fin structure; and implanting a dopant into the polysilicon.

11. The method of claim 10 further comprising forming a silicide atop the semiconductor region.

12. The method of claim 11, wherein forming the silicide comprises depositing a metal atop a silicon containing surface, and annealing to provide the silicide.

13. The method of claim 1, wherein the each end of the semiconductor fm structure that is substantially aligned to the exterior sidewall of the dielectric spacers extends a dimension that ranges from 2 nm to 12 nm from the exterior sidewall of the dielectric spacers.

* * * * *